United States Patent [19]
Liu et al.

[11] Patent Number: 5,652,513
[45] Date of Patent: Jul. 29, 1997

[54] PHASE SENSITIVE MAGNETIC RESONANCE TECHNIQUE WITH INTEGRATED GRADIENT PROFILE AND CONTINUOUS TUNABLE FLOW

[75] Inventors: Haiying Liu, Euclid; Paul M. Margosian, Lakewood; Yansun Xu, Willoughby Hills, all of Ohio

[73] Assignee: Picker International, Inc., Highland Heights, Ohio

[21] Appl. No.: 690,850

[22] Filed: Aug. 1, 1996

[51] Int. Cl.$^6$ .................................................. G01V 3/00
[52] U.S. Cl. ............................................. 324/306; 324/309
[58] Field of Search ................................. 324/306, 307, 324/309, 312, 310, 314, 300

[56] References Cited

U.S. PATENT DOCUMENTS

| | | | |
|---|---|---|---|
| 5,352,980 | 10/1994 | Machida | 324/309 |
| 5,363,042 | 11/1994 | Dumoulin | |
| 5,469,059 | 11/1995 | Dumoulin | 324/306 |
| 5,541,512 | 7/1996 | Dumoulin et al. | 324/306 |
| 5,548,216 | 8/1996 | Dumoulin et al. | 324/309 |

OTHER PUBLICATIONS

Pattany, P.M., et al., "Motion Artifact Suppression Technique (MAST) for MR Imaging," J. Comput. Assist. Tomogr., 11(3):369–377 (May/Jun. 1987).

Quencer, R.M., et al., "Cine MR in the evaluation of normal and abnormal CSF flow: intracranial and intraspinal studies," Neuroradiology, 32 (1990).

Firmin, D., et al., "Magnetic Resonance Flow Imaging," Chapter 10.

Bryant, D.J., et al., "Measurement of Flow with NMR Imaging Using a Gradient Pulse and Phase Difference Technique," J. Comput. Assit. Tomogr., 8(4):588–593 (Aug. 1984).

Dumoulin, D.L., et al., "Rapid Scan Magnetic Resonance Angiography," Mag. Res. Med., 5, 238–245 (1987).

Underwood, S.R., et al., "Magnetic resonance velocity mapping: clinical application of a new technique," Br Heart J, 57:404–12 (1987).

Klipstein, R.H., et al., "Blood flow patterns in the human aorta studied by magnetic resonance," Br Heart J, 58:316–23 (1987).

*Primary Examiner*—Louis M. Arana
*Attorney, Agent, or Firm*—Fay, Sharpe, Beall, Fagan, Minnich & McKee

[57] ABSTRACT

When a magnetic resonance imaging sequence is retrieved from memory (58), one of the slice select, phase-encode to read gradient profiles are retrieved for one of the slice select, phase-encode, read gradients. The two gradient profiles have a common field of view if a read gradient or slice thickness if a slice select gradient, but have different motion sensitizations. The reference gradient profile $G_1$ stored in a memory (52) and the motion sensitized gradient profile $G_2$ stored in a memory (56) are weighted (60, 62) by weighting functions $\alpha_1$, $\alpha_2$ which are selected in accordance with the selected motion sensitivity and a selected one of the field of view or slice thickness. The weighted profiles are combined (64) to generate a motion sensitized gradient with the selected motion sensitivity, field of view or slice thickness. The combined weighted gradient profile and the reference gradient profile are used in imaging sequences to generate reference and motion sensitized data lines (82, 84) which are reconstructed (86) into a reference image representation and a motion sensitized image representation. A moving tissue only image representation can be obtained (88) as well.

17 Claims, 5 Drawing Sheets

PHASE SENSITIVE MAGNETIC RESONANCE TECHNIQUE WITH INTEGRATED GRADIENT PROFILE AND CONTINUOUS TUNABLE FLOW

BACKGROUND OF THE INVENTION

The present invention relates to the art of magnetic resonance imaging (MRI) of moving substances. It finds particular application in conjunction with imaging and measuring blood flow velocity by phase mapping and will be described with particular reference thereto. However, it is to be appreciated that the present invention is also applicable to imaging or phase mapping, velocity determination, acceleration determination, and the like of other anatomical movements, non-biological fluid flows, multi-component systems in which one gaseous, fluid, semi-fluid, solid, or other components moves relative to other components, or the like.

Magnetic resonance imaging provides a non-invasive means of imaging and measuring in clinical and other settings. Some of the many important applications offered by such technology are magnetic resonance flow measurement and magnetic resonance angiography.

Magnetic resonance (MR) flow quantitation scans are used to diagnose certain diseases by monitoring blood flow. See Bryant D. J., Payne J. A., Firmin D. N., and Longmore D. B., J. Comput Assist Tomogr, v. 8, p. 588 (1984); Underwood S. R., Firmin D. N, Klipstein R. H., Rees R. S. and Longmore D. B., Br Heart J., v. 57, p. 404 (1987); Klipstein R. H., Firmin D. N., Underwood S. R., Rees R. S. and Longmore D. B., Brit. Heart J., v. 58, p. 316 (1987). Similarly, magnetic resonance flow quantitation techniques are used to diagnose diseases by identifying cerebrospinal fluid flow patterns. See Quencer, R. M., et.al., Neuroradiology 32 (1990).

Heretofore, magnetic resonance imaging subjects have been positioned in a temporally constant magnetic field such that selected dipoles preferentially align with the magnetic field. A radio frequency pulse is applied to cause the preferentially aligned dipoles to resonate and emit magnetic resonance signals of a characteristic resonance radio frequency. The radio frequency magnetic resonance signals from the resonating dipoles are read out for reconstruction into an image representation.

In a Fourier transform imaging technique, a read gradient is applied during the read out of the echo for frequency encoding along a read axis and a phase-encode gradient is pulsed to step phase-encoding along a phase-encode axis between echoes. In this manner, each echo generates a data line in k-space. The relative phase-encoding of the data lines controls their relative position in k-space. Conventionally, the data line with zero phase-encoding extends across the center of k-space. Data lines with a phase-encoding gradient stepped in progressively positive steps are generally depicted as being above the center line of k-space; and, data lines with progressively negative phase-encoding steps are depicted as being below the center line of k-space. In this manner, a matrix, such as a 256×256 or a 512×512, etc., matrix of data values in k-space is generated. Fourier transformation of these values generates a conventional magnetic resonance image.

To strengthen the received magnetic resonance signals, the free induction decay magnetic resonance signal is commonly refocused into an echo. This may be done by reversing the polarity of a magnetic field gradient to induce a field or gradient echo. Analogously, the radio frequency excitation pulse may be followed with a 180° radio frequency inversion pulse to refocus the signal as a spin echo. Moreover, by repeating the reversing of the magnetic field gradient, a series of gradient echoes can be generated following each radio frequency excitation pulse. Analogously, a series of spin echoes can be generated following each radio frequency excitation pulse by a series of the 180° radio frequency refocusing pulses. As yet another option, a single radio frequency excitation pulse can be followed by a mixture of spin and gradient echoes. See, for example U.S. Pat. No. 4,833,408 of Holland, et al.

There are several known techniques for measuring flows using magnetic resonance experiments. For the purpose of measuring the flow velocity of blood or cerebrospinal fluid using magnetic resonance imaging, an image or a set of complex images are obtained with the flow information encoded in them. A wide variety of non-invasive methods are used for measuring flow. These methods can be summarized into three major categories: in-flow/out-flow; time-of-flight; and flow phase shift.

The in-flow/out-flow technique is based on the image intensity modulation caused by the excited spin moving out and un-excited spin moving in the imaging plane. That is, tissue that was in the imaging plane during resonance excitation flows out of the imaging plane and is replaced by tissue that was outside of the imaging plane during resonance excitation. The faster the flow, the more complete the replacement of excited tissue with non-excited tissue between excitation and the echo.

Time of flight is based on the physical displacement of a tagged flowing spins with respect to the static spins in the plane of imaging in the time interval between RF excitation and data read-out. That is, resonance is excited in flowing tissue at a selected location to tag it. The location of the tagged tissue a short time later when an echo is generated is noted. The measurements of displacement and time provide an indication of flow.

The flow phase shift technique encodes the flow as an extra complex phase in the final image by means of a flow encoding gradient pulse. See Bryant D. J., Payne J. A., Firmin D. N, and Longmore D. B., J. Comput Assist Tomogr, v. 8, p. 588 (1984); Underwood S. R., Firmin D. N, Klipstein R. H., Rees R. S and Longmore D. B., Br Heart J., v. 57, p. 404 (1987); Klipstein R. H., Firmin D. N, Underwood S. R., Rees R. S and Longmore D. B., Brit. Heart J., v. 58, p. 316 (1987). The flow encoding pulse often consists of an isolated bi-polar or multipolar gradient pulse placed before the read-out acquisition to encode the flow. See Dumoulin, et al., Magn. Reson. Imaging, v. 5, p. 238 (1987). See also FIG. 1 showing a schematic MRI sequence diagram having the bi-polar pulse. The hi-polar pulse can be placed along any one of the three imaging gradients, read, phase and slice.

For phase contrast magnetic resonance imaging in the presence of a magnetic field gradient, moving spins with a velocity value v along the direction of a gradient acquire an extra complex phase over those stationary spins as shown below:

$$\phi = \phi_0 + \gamma \int_0^{TE} G(t) vt \, dt + \gamma \int_0^{TE} G(t) \frac{at^2}{2} \, dt + \qquad (1)$$

-continued $$\gamma \int_0^{TE} G(t) \frac{p t^3}{6} dt,$$

where: $\gamma$ is the magnetogyric ratio; G(t) is the imaging magnetic gradient field strength of interest at time t measured from the coherent center of the RF excitation pulse coherent center when all the spins are in phase; and $\phi_0$ is the background phase of stationary spins. Flow acceleration a and pulsatility p are assumed to be small such that their phase contributions can be ignored. This phenomena of phase anomalies in the presence of a magnetic field gradient is used in the gradient waveform design of magnetic resonance imaging sequence (either field echo or spin echo) to measure flow velocity in an in vivo biological system.

For a two-point encoding technique, two different polarities of a bi-polar gradient are used to encode flow velocity in two data acquisitions, which are performed interleaved with respect to each other. The flow raw data of reference and sensitized acquisitions are Fourier transformed and phase reconstructed, respectively. The phase difference between sensitized and reference phase images ideally is proportional to flow velocity (assuming background phase of the phase difference image is zero), i.e.:

$$\Delta\phi = \phi_{sen} - \phi_{ref} \qquad (2).$$

The phase difference image can be directly converted into a flow velocity map V, whose pixel intensity is in cm/sec or other selected units.

$$V = \frac{\pi \Delta\phi}{180 \, \Delta m_1}, \qquad (3)$$

where $\phi$ is the phase difference image in degree, and $\Delta m_1$ is the flow velocity sensitization difference of two sequence pairs in RAD sec/cm. Ideally, without further phase correction on a self-shielded gradient/system, the background (stationary tissue) intensity should be zero (where there is no flow).

The isolated bi-polar flow encoding pulse technique has disadvantages. Placing an isolated bi-polar flow encoding gradient pulse before read-out prolongs the repeat time of the sequence TR and prolongs the echo time TE. The solution of simply integrating the flow encoding gradient with the spatial encoding gradient allows reduction of TE and TR. However, this solution introduces undesirable spatial FOV or slice thickness dependence of the flow encoding. Furthermore, the flow sensitivity of these types of sequences takes only discrete values.

Further, in practice it is difficult to maintain a sufficient dynamical range for a certain flow to be measured. If the flow velocity is outside the effective range of the integrated pulse, the results exhibit the problems of phase wrap and aliasing. To avoid such problems, many flow sequences with different flow sensitivities must be designed to cover a desired range of flow velocities. Each flow sequence would be used over a different velocity range.

The present invention is directed to a new and improved data acquisition technique which overcomes the above-referenced problems and others.

SUMMARY OF THE INVENTION

The present invention provides a simple and useful improvement for the design and implementation of a flow sensitive sequence, such as flow quantitation and phase contrast angiography on a standard MRI system. It offers a continuous tunable MR flow sensitivity capability at shorter echo times for MRI flow sensitive imaging by integrating the flow encoding gradient and spatial encoding gradient into one composite gradient waveform in the pulse sequence design. In the present method, the flow sensitivity is completely independent of the other imaging spatial parameter changes.

One advantage of the present invention is that it facilitates acquisition of magnetic resonance data for a variety of flow patterns and velocities.

Another advantage of the present invention is that it can be easily and simply implemented on any standard MRI system without a need for a hardware upgrade.

Another advantage of the present invention is that it improves image quality, particularly by minimizing phase wrap and aliasing.

Another advantage of the present invention is that the technique decreases scan time.

Another advantage of the present invention is that the technique provides sequences having reduced echo times.

Yet another advantage of the present invention is that it provides integrated gradient profiles.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
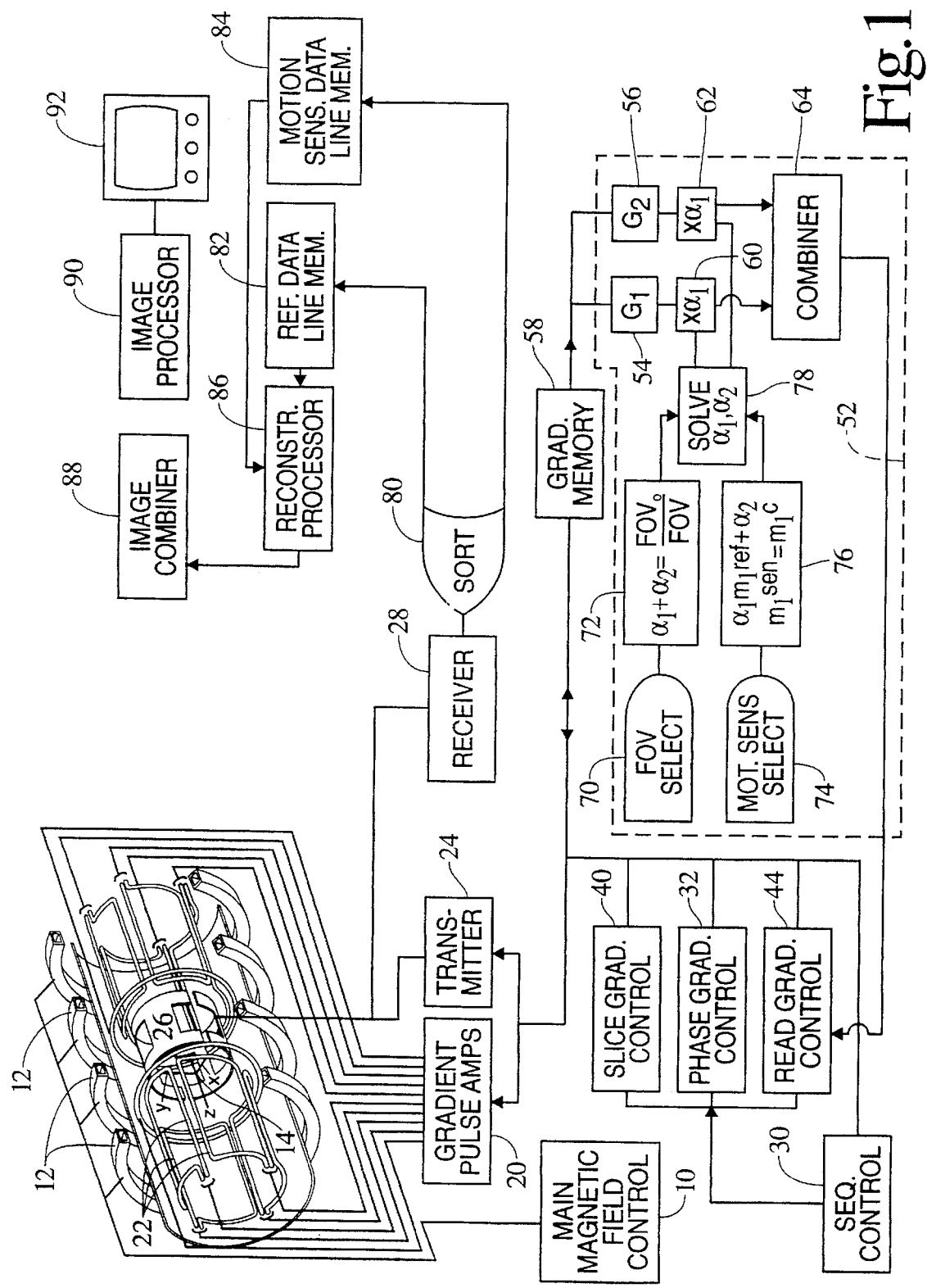
FIG. 1 is a diagrammatic illustration of a magnetic resonance imaging system in accordance with the present invention.

With reference to FIG. 1, a main magnetic field control 10 controls superconducting or resistive magnets 12 such that a substantially uniform, temporally constant magnetic field is created along a z-axis through an examination region 14. A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, saturate spins, and the like in order to generate magnetic resonance imaging and spectroscopy sequences. More specifically, gradient pulse amplifiers 20 apply current pulses to selected ones or pairs of whole body gradient coils 22 to create magnetic field gradients along x, y, and z-axes of the examination region. A digital radio frequency transmitter 24 transmits radio frequency pulses or pulse packets to a whole body RF coil 26 to transmit RF pulses into the examination region.

A typical radio frequency pulse is composed of a packet of immediately contiguous pulse segments of short duration which taken together with each other and any applied gradients achieve a selected magnetic resonance manipulation. The RF pulses are used to saturate spins, excite resonance, invert magnetization, refocus resonance, or manipulate resonance in selected portions of the examination region. For whole body applications, the resonance signals are commonly picked up by the whole body RF coil 26.

A sequence control 30 controls the gradient pulse amplifiers 20 and the transmitter 24 to generate any of a plurality of multiple echo sequences, including echo-planar imaging, echo-volume imaging, gradient and spin echo imaging, fast spin echo imaging, and the like. More specifically to the preferred embodiment, the sequence control 30 generates a two-dimensional gradient echo magnetic resonance imaging sequence by coordinating the activity of the slice gradient control, the phase gradient control, the read gradient control, and the RF transmitter.

Figure 2:
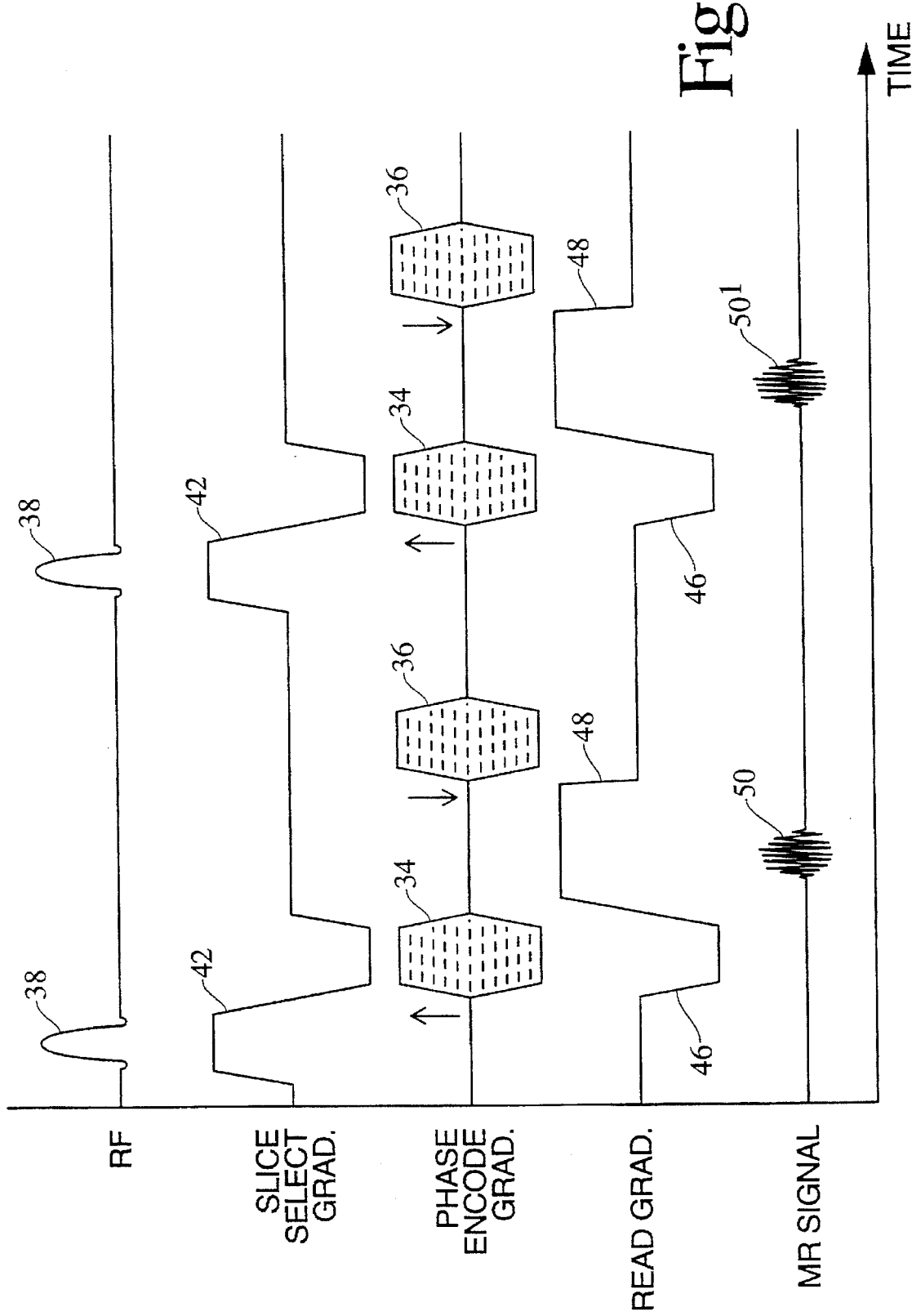
FIG. 2 illustrates a repeat of an exemplary gradient echo imaging sequence.

With continuing reference to FIG. 1 and further reference to FIG. 2, the sequence control 3 controls a phase-encode gradient controller 32. The phase-encode gradient controller 32 causes the gradient amplifiers 20 to cause an initial phase-encode gradient 34 with one of a plurality of phase-encode gradient amplitude steps. A phase-unwrapping gradient pulse 36 equal and opposite to the sum of the preceding phase-encodings is applied by phase-encode gradient pulses such that the net phase-encoding is zeroed prior to application of each next RF pulse 38.

The sequence control 30 also controls a slice select gradient control 40 which controls the gradient amplifiers 20 to cause slice select gradient pulses 42 concurrently with the RF excitation and magnetic gradient refocussing pulses. The slice select gradients are used in a single or multiple-slice examination procedure to limit the excitation to a single slice. Alternately, a slab selection pulse may be applied to limit excitation to a slab that is several slices in thickness. The slab is encoded in three-dimensions with a combination of phase and read gradients.

The sequence control 30 further controls a read gradient control 44. The read gradient control causes a first polarity read gradient portion 46 which is reversed to form an opposite polarity read gradient portion 48. The gradient reversal induces a field or gradient echo 50.

Figure 3A:
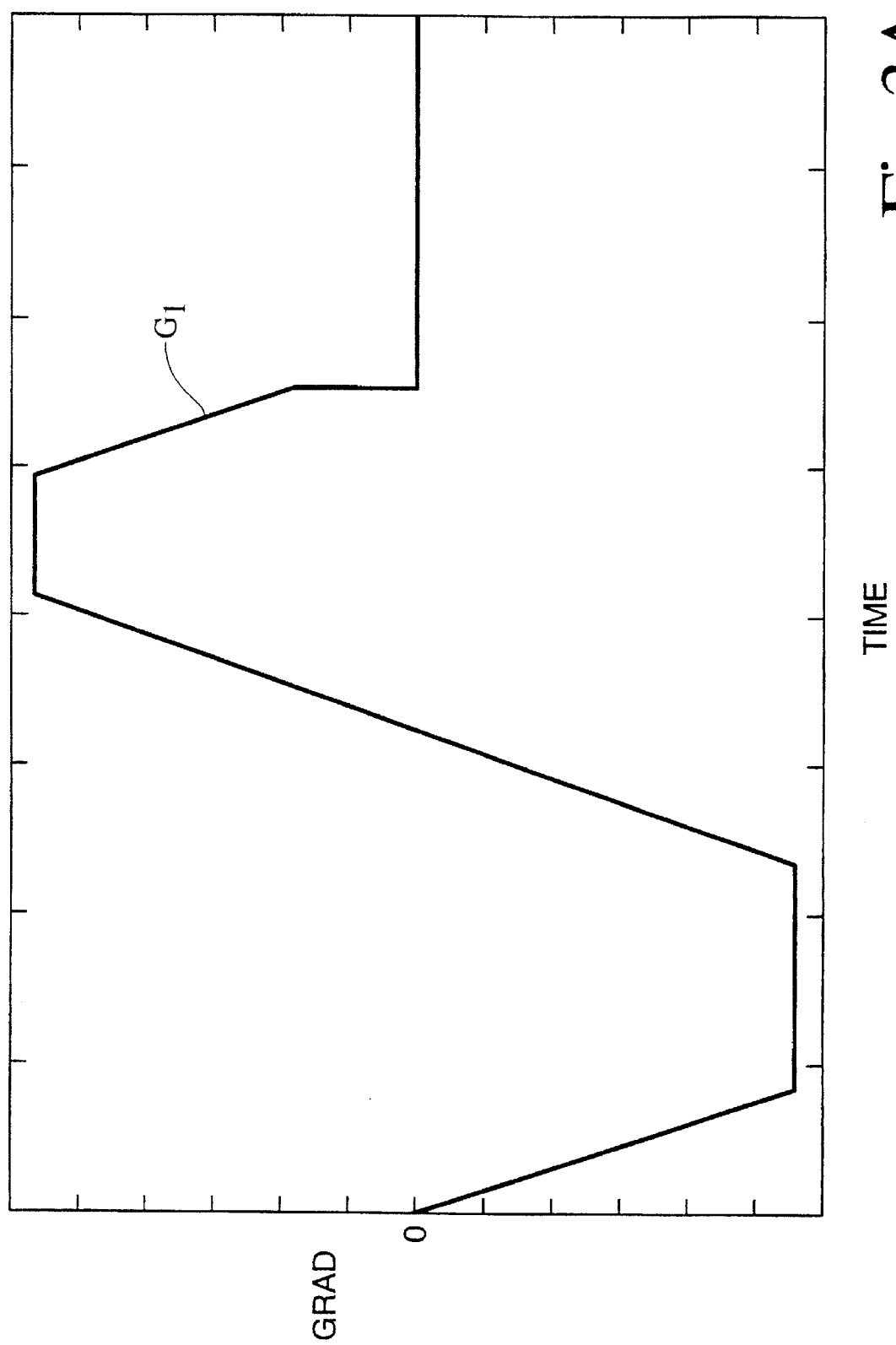
FIG. 3A illustrates an exemplary reference read gradient.
Figure 3B:
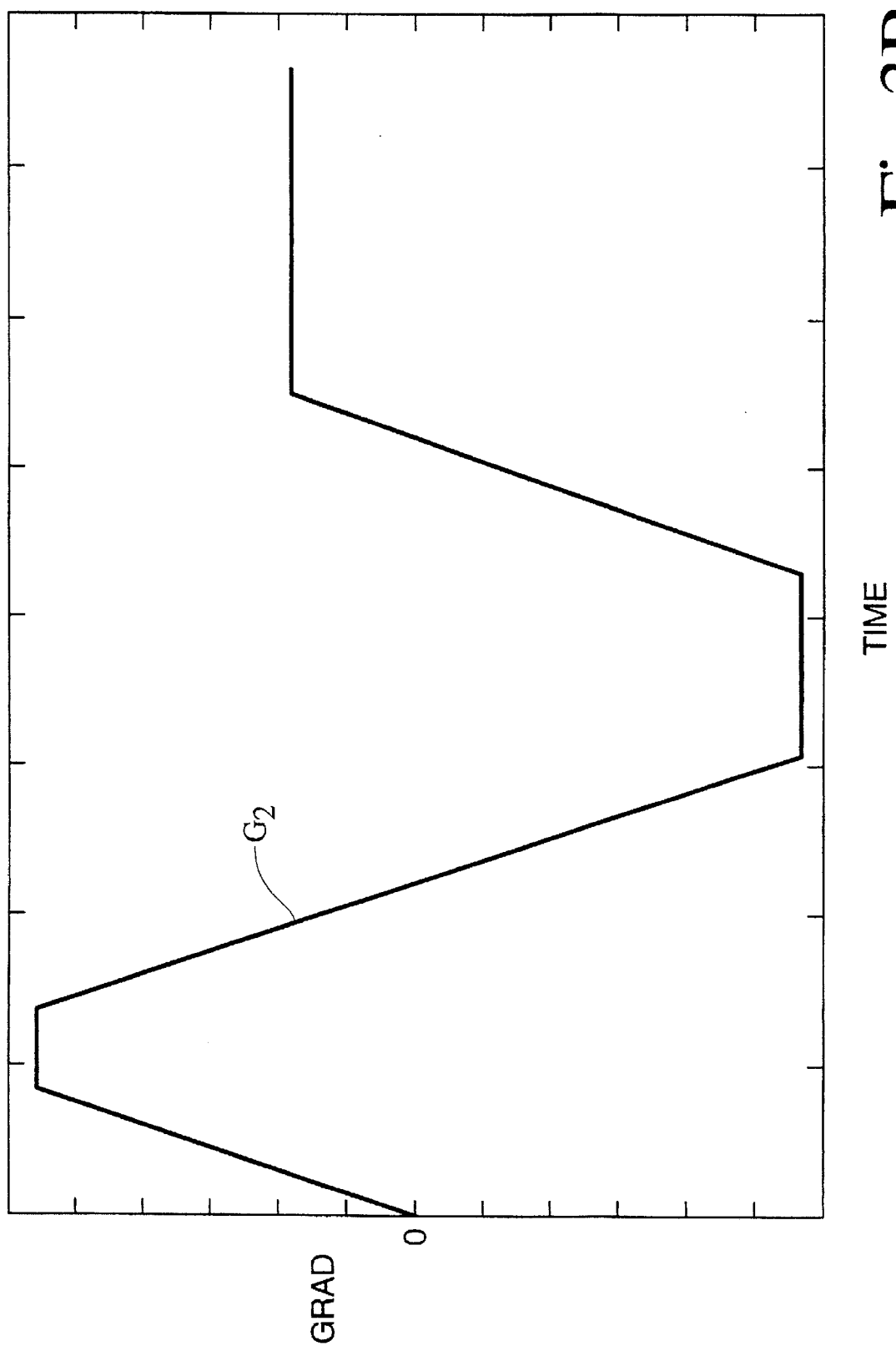
FIG. 3B illustrates an exemplary motion sensitized read gradient.
Figure 3C:
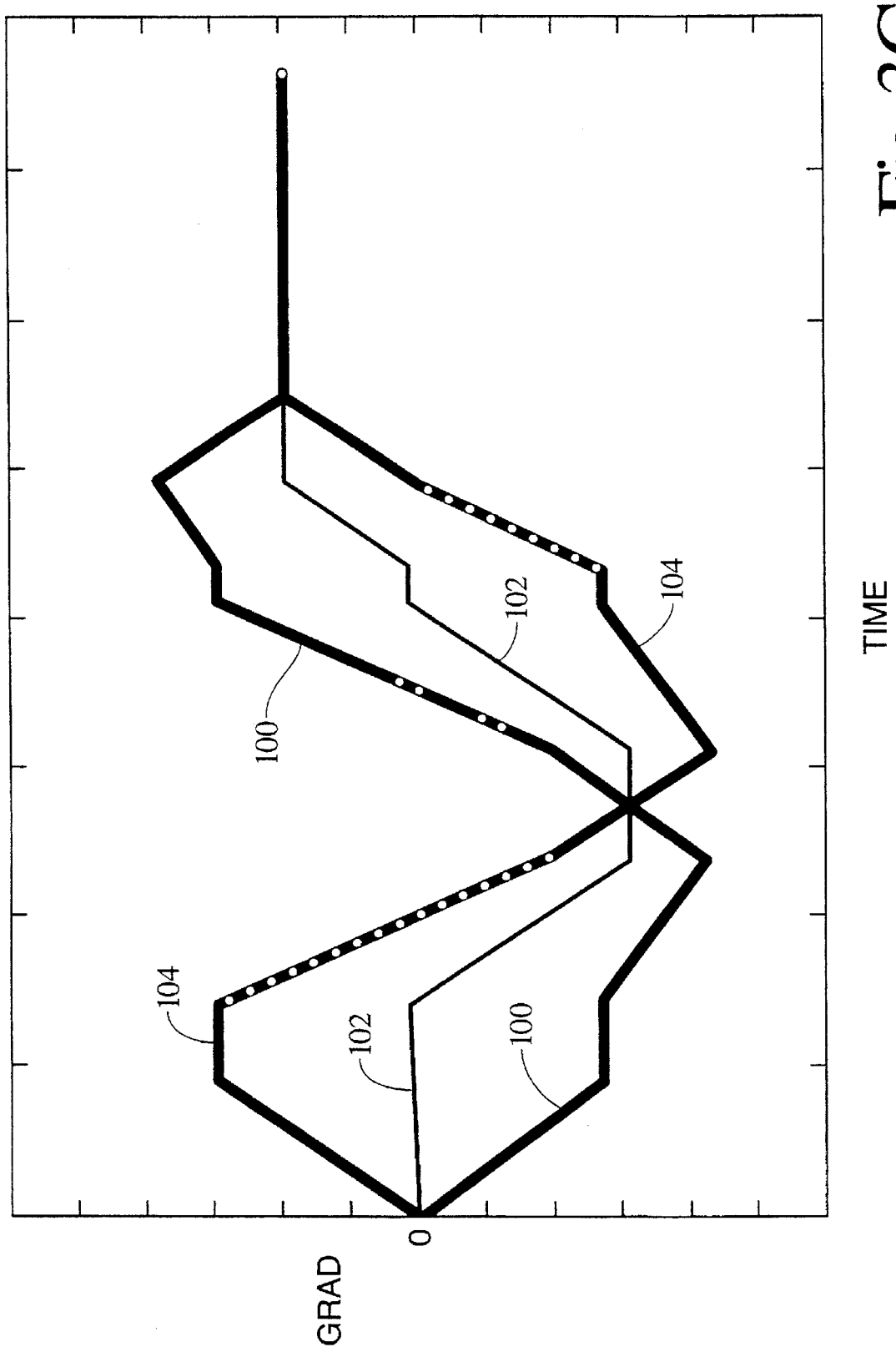
FIG. 3C illustrates various weighted combinations of the gradients of FIGS. 3A and 3B.

The sequence control 30 also controls a flow encoding circuit 52 for generating the waveforms for generated reference and flow encoded views or data lines. More specifically, a pair of gradient memories 54, 56 stores a reference gradient $G_1$ with a minimum field of view and a motion sensitized gradient $G_2$ also with the minimum field of view. In the illustrated embodiment, the gradient $G_1$ and $G_2$ are the read gradient. However, it is to be appreciated, that the motion sensitivity can be encoded analogously along any one or more of the axes, i.e., in the read, slice select, or phase-encode directions. A typical reference read gradient is illustrated in FIG. 3A and a typical motion sensitized read gradient is illustrated in FIG. 3B. The motion sensitized gradient has a bimodal motion sensitizing pulse incorporated therein.

The reference and motion sensitized gradient profiles are weighted and combined to produce the read gradient which is actually applied. More specifically, a multiplier 60 multiplies the first gradient profile $G_1$ by a first weighting factor $\alpha_1$. A second multiplier 62 multiplies the second gradient profile $G_2$ by a second weighting factor $\alpha_2$. A combining circuit 64 such as an adder which adds the two profiles point by point, combines the two-weighted gradient profiles.

The read gradient control 44 loads appropriate reference and motion sensitized read gradients from a gradient memory 58 into the gradient profile memories 54 and 56. As explained in greater detail before, the weighting factors $\alpha_1$ and $\alpha_2$ are adjusted to adjust the field of view and/or the degree of motion sensitivity. More specifically, a field of view selection device 70 is operated by the operator to select a desired field of view. More specifically, a ratio of the reference field of view $FOV_0$ to the selected field of view FOV is equal to the sum of the two weighting factors $\alpha_1$ and $\alpha_2$, which relationship is stored into memory 72. Thus, as explained in greater detail below, the field of view selection scales the weighting factors with the minimum field of view having the largest weighting factors, e.g., for $FOV_0=FOV$, $\alpha_1+\alpha_2=1$. Analogously, a motion sensitivity selection device 74 enables the operator to select the relative amount of motion sensitivity. That is, the difference in motion sensitivity between the motion sensitivity provided by the reference profile $G_1$ and the motion sensitivity provided by the motion sensitizing profile $G_2$. In the preferred embodiment the reference profile $G_1$ is selected such that it has no motion sensitivity. As explained in greater detail below, the selected motion sensitivity $m_1^c$ is equal to the weighted sum of the motion sensitivity $m_1^{ref}$ of the first gradient profile $G_1$ and the motion sensitivity $m_1^{sen}$ of the second gradient profile $G_2$. This relationship is stored in a memory 76. A processor 78 solves the relationship stored in memory 72 and 76 to determine the appropriate relating factors $\alpha_1$ and $\alpha_2$ for the selected field of view and motion sensitivity.

With reference again to FIG. 2, two data lines are generated for each phase-encode step of k-space, one with the reference flow sensitization and a second whose flow sensitization differs from the flow sensitization of the reference sequence by the selected amount. In the embodiment in which the flow is sensitized along the read gradient, the radio frequency excitation pulse 38 is applied in the presence of the slice select gradient 42 to excite resonance in the selected slice. The resonance is phase-encoded with one of the phase-encoding steps 34 and a read gradient profile 46, 48 is applied. More specifically, the gradient profile $G_1$ as weighted by the weighting factor $\alpha_1$ is applied in this repetition to generate a reference data line with the selected field of view. This sequence is repeated by applying another RF pulse 38 in the presence of the same slice select gradient 42. The excited resonance is encoded with the same phase-encode gradient step 34 and read out in the presence of the combined read gradient as output by the gradient profile adder 64, see FIG. 1, i.e., the gradient $\alpha_1 G_1+\alpha_2 G_2$. In this manner, a reference data line is derived from the reference echo 50 and a motion sensitized data line is derived from a motion sensitized echo 50'.

With reference again to FIG. 1, the receiver 28 converts the reference and motion sensitized echoes into corresponding reference and motion sensitized data lines which are sorted 80 and stored in a reference data line memory 82 and a motion sensitized data line memory 84. A reconstruction processor 86 reconstructs reference and motion sensitized images from the stored data lines. An image combining circuit 88 subtracts the reference and motion sensitized images to generate an image with flowing material only. An image processor 90 converts one or more of the reference, motion only, and motion sensitized images into appropriate format for display on a human readable monitor 92. Various display options are contemplated. For example, an image of only flowing tissue may be displayed. To help relate the flowing tissue to anatomical markers, the reference image (preferably with no motion sensitivity) can be displayed concurrently and superimposed in black and white or reduced intensity to differentiate it from the flow only image.

Referring generally to FIGS. 1, 2 and 3A–3C, in order to describe the principles of the invention more clearly, all gradient profiles are created by linearly combining two bases profiles $G_1$ and $G_2$ for reference imaging and flow sensitization purposes. A combined gradient pulse profile G is obtained from two bases gradient pulse profiles, which are designed for a set of minimum spatial parameters, such as field of view and slice thickness denoted as $FOV_0$ and $SLTK_0$. The combined gradient profile is expressed as follows:

$$G = \alpha_1 G_1 + \alpha_2 G_2 \qquad (4),$$

where $\alpha_1$ and $\alpha_2$ are two positive mixing coefficients preferably satisfying $\alpha_1 + \alpha_2 = 1$. These two gradient profiles can be two gradients along any of the read, phase-encode and slice select directions. The wave form of the basis gradient can be of arbitrary shape. Each of the original gradient profiles does not exceed the maximum gradient amplitude range and maximum gradient slew rate. Thus, when the two profiles are linearly combined, the combined profile also does not exceed the maximum gradient amplitude range and maximum gradient slew rate.

FIG. 3A shows an exemplary reference read gradient profile $G_1$ and FIG. 3B shows a flow sensitized or compensated gradient profile $G_2$ for cerebrospinal fluid flow sensitization. FIG. 3 illustrates differently weighted integrations of the two profiles or waveforms G. A first integrated read gradient profile 100 is weighted 75% of the reference gradient $G_1$ and 25% of the flow sensitized gradient $G_2$. A second integrated profile 102 is weighted 50% of the reference gradient $G_1$ and 50% of the flow sensitized gradient $G_2$. A third integrated profile 104 is weighted 25% of the reference gradient $G_1$ and 75% of the flow sensitized gradient $G_2$.

The first order moment $m_1$ of a gradient pulse profile in time G(t) is defined as:

$$m_1 = 2\pi\gamma \int_0^{TE} G(t) t \, dt, \qquad (5)$$

where: $\gamma$ is gyromagnetic (magnetogyric) ratio, commonly 4257 Hz/Gauss for hydrogen; G(t) denotes gradient strength in Hz/cm; and t is time variable in seconds. The moment $m_1$ is in radian/cm/sec.

For a perfectly flow compensated gradient pulse, the corresponding first order temporal moment of the gradient waveform is zero ($m_1=0$). A sequence using such a gradient pulse would be completely insensitive to motion in the direction in which the gradient moment is zero.

The first order moment difference $\Delta m_1$ between the reference gradient first order moment $m_1^{ref}$ and the sensitized gradient first order moment $m_1^{sen}$ is a measure of flow sensitivity or the sensitization of a sequence pair, which can be written as:

$$\Delta m_1 = m_1^{sen} - m_1^{ref} \qquad (6).$$

An aliasing velocity ($V_s$) of the flow sequence pair is defined as a velocity value which corresponds to generating a $2\pi$ radian phase shift, i.e.:

$$V_s = \frac{2\pi}{\Delta m_1}. \qquad (7)$$

The aliasing velocity is similar to the field of view (FOV) in spatial dimension. This can be thought of as field of view in the velocity dimension. A velocity faster than $V_s$, will wrap around and appear as a slower velocity in a flow image or map. The first order moment of the combined gradient wave form G is expressed as:

$$m_1(G) = \alpha_1 m_1(G_1) + \alpha_2 m_1(G_2) \qquad (8).$$

The first order moment is linearly related to the gradient strength G. For any gradient profile, as the field of view (FOV) or slice thickness (SLTK) changes, the corresponding gradient first order moment changes linearly.

$G_2$ and $G_1$ denote a flow sensitized and compensated gradients, respectively. For flow sensitivities, the following parameters are defined as:

$$m_1^c = m_1(G) \qquad (9a),$$

$$m_1^{ref} = m_1(G_1) \qquad (9b),$$

$$m_1^{sen} = m_1(G_2) \qquad (9c).$$

The overall flow sensitization as function of the mixing coefficient without changing FOV and SLTK is given by $$\Delta m_1^c = m_1^c - m_1^{ref}, \qquad (10a)$$

$$= \alpha_2 (m_1^{sen} - m_1^{ref}), \qquad (10b)$$

$$= \alpha_2 \Delta m_1. \qquad (10c)$$

where coefficient $\alpha_2$ is between 0 and 1.

The velocity sensitivity of a flow sequence depends on the field of view and the slice thickness used during imaging data acquisition. To make this velocity sensitization immune to the FOV/SLTK change, the mixing coefficients $\alpha_1$ and $\alpha_2$ are chosen to meet the following conditions:

$$\alpha_1 + \alpha_2 = f \qquad (11a),$$

$$\alpha_1 m_1^{ref} + \alpha_2 m_1^{sen} = m_1^c \qquad (11b),$$

where spatial parameter f is a ratio of the minimum or reference field of view (FOV) or slice thickness ($SLTK_0$) to the selected field of view (FOV) or slice thickness (SLTK), i.e., $f = FOV_0/FOV$ (or $SLTK_0/SLTK$) < 1, and where two first order moments $m_1^{ref} < m_1^{sen}$. Solving equations (11a) and (11b), the two mixing coefficients are obtained as:

$$\alpha_1 = \frac{f m_1^{sen} - m_1^c}{m_1^{sen} - m_1^{ref}}, \qquad (12a)$$

$$\alpha_2 = \frac{m_1^c - f m_1^{ref}}{m_1^{sen} - m_1^{ref}}. \qquad (12b)$$

For a set of positive combination coefficients, the possible range for $m_1$ for the combined gradient is:

$$f m_1^{ref} < m_1^c < f m_1^{sen} \qquad (13).$$

The overall flow sensitization of a sequence pair as a function of the mixing coefficient considering FOV/slice thickness change is given by:

$$\Delta m_1^c = m_1^c - fm_1^{ref}, \quad (14a)$$

$$= \alpha_2 (m_1^{sen} - m_1^{ref}), \quad (14b)$$

$$= \alpha_2 \Delta m_1. \quad (14c)$$

The corresponding aliasing velocity of the flow sequence pairs (or velocity range) is:

$$V_s^c = \frac{2\pi}{\Delta m_1^c}, \quad (15a)$$

$$= \frac{2\pi}{\alpha_2 \Delta m_1}, \quad (15b)$$

$$= \frac{V_s}{\alpha_2}. \quad (15c)$$

The maximum amplitude and slew rate of such a combined gradient profile is less than the maximum amplitude /G/ and slew rate dG/dt of the original two base gradient profiles:

$$|G| = |\alpha_1 G_1 + \alpha_2 G_2|, \quad (16a)$$

$$\leq \alpha_1 |G_1| + \alpha_2 |G_2|, \quad (16b)$$

$$\leq \alpha_1 G_{max} + \alpha_2 G_{max}, \quad (16c)$$

$$\leq G_{max}. \quad (16d)$$

$$\left|\frac{dG}{dt}\right| = \left|\alpha_1 \frac{dG_1}{dt} + \alpha_2 \frac{dG_2}{dt}\right|, \quad (17a)$$

$$\leq \alpha_1 \left|\frac{dG_1}{dt}\right| + \alpha_2 \left|\frac{dG_2}{dt}\right|, \quad (17b)$$

$$\leq \alpha_1 \left(\frac{dG}{dt}\right)_{max} + \alpha_2 \left(\frac{dG}{dt}\right)_{max}, \quad (17c)$$

$$\leq \left(\frac{dG}{dt}\right)_{max}. \quad (17d)$$

There are a number of gradient profile combination schemes appropriate for the invention. Two of such gradient profile combination schemes are total gradient profile combination and partial gradient profile combination.

In the total gradient profile combination technique, an entire gradient profile for any axis is generated by combining the reference imaging and flow sensitization profiles. To extend the range of flow sensitivity, i.e., eliminate the interaction between FOV/SLTK and flow sensitization, in the same framework of software, the combination coefficients for the entire gradient profile are computed slightly differently. While the combination remains linear, the coefficients no longer must be positive.

In the total gradient profile combination technique the two gradient profiles (fully compensated and sensitized) are designed to satisfy the following:

1) each satisfy the slew rate and amplitude requirements and all segments match each other exactly;
2) the timing of the difference gradient profile of the two extreme profiles (G1, G2) also fulfills the slew rate and amplitude requirements;
3) the difference profile has opposite gradient lobes with respect to compensated profile.

Thus, the velocity sensitivity range can be extended as follows:

$$fm_1^{ref} < m_1^c < fm_1^{ref} + \Delta m_1^0 \quad (18),$$

where $\Delta m_1 0$ is the required flow sensitivity.

For a set of PCA/FLOW sequence designed for minimum field of view $FOV_0$, slice thick $SLTK_0$ and velocity Sensitivity $V_0$, the combination coefficients for both reference and sensitized profiles can be computed for a certain user selected velocity V ($V > V_0$) as follows:

1) The combined reference profile is expressed as:

$$\alpha_1 = f, \quad \alpha_2 = 0 \quad (19a),$$

$$\alpha_1 m_1^{ref} = m_1^c \quad (19b).$$

2) The combined sensitized profile is expressed as:

$$\alpha_1 + \alpha_2 = f \quad (20a),$$

$$\alpha_1 m_1^{ref} + \alpha_2 m_1^{sen} = \Delta m_1 + fm_1^{ref} \quad (20b),$$

where $$\Delta m_1 = 1/V, \quad (20c)$$

$$\Delta m_1^0 = m_1^{sen} - m_1^{ref} = 1/V_0, \quad (20d)$$

where the imaging field of view ratio $f = FOV_0/FOV$ (or $SLTK_0/SLTK) < 1$, and two first order moments $m_1^{ref} < m_1^{sen}$. Solving Equations (20a) and (20b), the two mixing coefficients become:

$$\alpha_1 = \frac{fm_1^{sen} - m_1^c}{m_1^{sen} - m_1^{ref}} = f - \frac{V_0}{V}, \quad (21a)$$

$$\alpha_2 = \frac{m_1^c - fm_1^{ref}}{m_1^{sen} - m_1^{ref}} = \frac{V_0}{V}, \quad (21b)$$

where $$m_1^c = \Delta m_1 + f m_1^{ref} \quad (21c),$$

where $f = FOV_0/FOV$ or $SLTK_0/SLTK$.

Table of combination coefficients for different sensitivity and directions 2D and 3D

| Axis\Seq. | Ref. | Sen. (SS) | Sen. (PE) | Sen. (RD) | Sen. (ALL) |
|---|---|---|---|---|---|
| SS | $\alpha_1 = f,$ $\alpha_2 = 0.$ | $\alpha_1 =$ $f - V_0/V,$ $\alpha_2 = V_0/V.$ | $\alpha_1 = f,$ $\alpha_2 = 0.$ | $\alpha_1 = f,$ $\alpha_2 = 0.$ | $\alpha_1 =$ $f - V_0/V,$ $\alpha_2 = V_0/V.$ |
| PE | $\alpha_1 = f,$ $\alpha_2 = 0.$ | $\alpha_1 = f,$ $\alpha_2 = 0.$ | $\alpha_1 =$ $f - V_0/V,$ $\alpha_2 = V_0/V.$ | $\alpha_1 = f,$ $\alpha_2 = 0.$ | $\alpha_1 =$ $f - V_0/V,$ $\alpha_2 = V_0/V.$ |
| RD | $\alpha_1 = f,$ $\alpha_2 = 0.$ | $\alpha_1 = f,$ $\alpha_2 = 0.$ | $\alpha_1 = f,$ $\alpha_2 = 0.$ | $\alpha_1 =$ $f - V_0/V,$ $\alpha_2 = V_0/V.$ | $\alpha_1 =$ $f - V_0/V,$ $\alpha_2 = V_0/V.$ |

The partial gradient profile combination technique is a simplified version of gradient profile combination scheme. In the partial technique, only a sub-region of a whole gradient profile is required to be combined. With some additional restrictions on the gradient profiles, the integrated flow sequence is completely immune to FOV and slice thickness change.

Similar to the total combination technique, two gradient profiles ($G_1$ and $G_2$) are used for each imaging axis. $G_1$ is a flow compensated gradient and $G_2$ is a flow sensitizing bi-polar gradient with the following parameters:

$$m_1^c = m_1(G) \quad (22a),$$

$$m_1^{comp} = m_1(G_{comp}) \quad (22b),$$

$$m_1^{bp} = m_1(G_{bp}) \quad (22c).$$

As long as original profiles are designed according to limitations below, the combined gradient profile can be made to meet the slew rate and amplitude requirement.

The compensated gradient profile has three lobes with alternating polarities. Two lobes of the bi-polar gradient profile are correspondingly matched in time to the two lobes of the compensated gradient profile.

|  | Compensated | Bi-polar |
| --- | --- | --- |
| Slice select | $G_1^{ss}$ | $G_2ss$ |
| Phase-encode | $G_1^{pe}$ | $G_2pe$ |
| Read out | $G_1^{rd}$ | $G_2rd$ |

A combined gradient pulse profile can be obtained from these two gradient pulse profiles, namely fully compensated and bi-polar gradients ($G_{comp}$ and $G_{bp}$) designed for a minimum field of view ($FOV_0$), slice thickness ($SLTK_0$) and flow sensitivity ($V_0$). The combined gradient pulse profile is expressed as:

$$G = \alpha_1 G_{comp} + \alpha_2 G_{bp} \qquad (23)$$

where $\alpha_1$ and $\alpha_2$ are two positive mixing coefficients satisfying $\alpha_1 = f < 1$, $\alpha_2 < 1$. These two gradient profiles can be on any one of the read, phase-encode and slice select axes. Such a linearly combined gradient profile, can be readily shown, does not exceed maximum gradient amplitude and maximum gradient slew rate allowed as long as original profiles do not.

The first order moment difference between the reference (being fully compensated $m_1 = 0$) and sensitized gradients is a measure of flow sensitivity or sensitization of a sequence pair, which can be written as:

$$\Delta m_1 = m_1^{sen} - m_1^{ref} = m_1^{combined} - m_1^{comp} \qquad (24)$$

Velocity value ($V_0$) of the base flow sequence pair for $2\pi$ radians phase shift is defined as:

$$V_o = \frac{2\pi}{\Delta m_1} \qquad (25)$$

The first order moment of the combined gradient wave form is:

$$\begin{aligned} m_1(G) &= \alpha_1 m_1(G_{comp}) + \alpha_2 m_1(G_{bp}), & (26a) \\ &= \alpha_2 m_1(G_{bp}). & (26b) \end{aligned}$$

and first order moment is linearly related to gradient strength G. For any gradient profile, as field of view (FOV), slice thickness (SLTK) and flow sensitivity (V) changes, the corresponding gradient first order moment changes in a linear fashion.

The overall flow sensitization as a function of the mixing coefficients with or without changing FOV or SLTK is given by:

$$\begin{aligned} \Delta m_1^c &= m_1^c - m_1^{ref}, & (27a) \\ &= \alpha_2 m_1^{bp}. & (27b) \end{aligned}$$

The mixing coefficients are chosen as follows:

$$\alpha_1 = f, \qquad (28a)$$

$$\alpha_2 = \frac{\Delta m_1}{m_1^{bp}} = \frac{V_{bp}}{V_s}, \qquad (28b)$$

where:

$$V_s = \frac{2\pi}{\Delta m_1^c}, \qquad (29a)$$

$$V_{bp} = \frac{2\pi}{m_1^{bp}}. \qquad (29b)$$

A complete separation of FOV/SLTK scaling and velocity scaling is also achieved. The two methods are basically equivalent in theory.

Below is a table of combination coefficients for different sensitivity directions (un-balanced). These apply for both 2D and 3D sequences.

| Axis | Ref. | Sen. (SS) | Sen. (PE) | Sen. (RD) | Sen. (ALL) |
| --- | --- | --- | --- | --- | --- |
| SS | $a_1 = f,$ | $a_1 = f,$ | $a_1 = f,$ | $a_1 = f,$ | $\alpha_1 = f,$ |
|  | $\alpha_2 = 0.$ | $\alpha_2 = V_o/V.$ | $\alpha_2 = 0.$ | $\alpha_2 = 0.$ | $\alpha_2 = V_o/V.$ |
| PE | $a_1 = f,$ | $a_1 = f,$ | $a_1 = f,$ | $a_1 = f,$ | $a_1 = f,$ |
|  | $\alpha_2 = 0.$ | $\alpha_2 = 0.$ | $\alpha_2 = V_o/V.$ | $\alpha_2 = 0.$ | $\alpha_2 = V_o/V.$ |
| RD | $a_1 = f,$ | $a_1 = f,$ | $a_1 = f,$ | $a_1 = f,$ | $a_1 = f,$ |
|  | $\alpha_2 = 0.$ | $\alpha_2 = 0.$ | $\alpha_2 = 0.$ | $\alpha_2 = V_o/V.$ | $\alpha_2 = V_o/V.$ | where $f = FOV_0/FOV$ or $SLTK_0/SLTK$

In a more simple alternative to the techniques above, the gradient waveforms are simply a set of trapezoidal, sinusoidal or other shaped pulses. Zero crossing of these isolated pulses are the same in the reference and sensitized sequences.

The basis waveforms can be generated by an automatic calculation based on a simple MAST calculation or an optimization of certain sets of moments for a MRI flow sequence on the fly.

The combination method can be applied to a complete and partial gradient profiles as well as 1,2 and 3 imaging gradient profiles, namely read, phase and slice. The same idea can be applied to other similar sequence such as diffusion weighted acquisition.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance imaging system which includes a magnet for generating a temporally constant magnetic field through an examination region, a radio frequency pulse controller and transmitter for inducing dipoles in the examination region to resonance such that radio frequency resonance signals are generated, gradient magnetic field coils and a gradient magnetic field controller for generating at least one of slice, phase and read magnetic field gradient pulses in orthogonal directions across the examination region, a receiver for receiving and demodulating the radio frequency magnetic resonance signals after each reversal of the read gradient to produce a series of data lines, and an image memory for storing a reconstructed image representation, further comprising:

a circuit for dynamically adjusting at least one of the magnetic field gradients to adjust both (i) motion sensitization and (ii) at least one of field of view and slice thickness.

2. The magnetic resonance imaging system as set forth in claim 1 further including:
   a first memory for storing a reference gradient profile with a minimal motion sensitization and at least one of a minimum field of view and a minimum slice thickness;
   a second memory for storing a motion sensitized gradient profile with the same at least one of minimum field of view and minimum slice thickness;
   a first weighting factor adjusting circuit for adjusting the reference gradient profile from the first memory by a first weighting factor;
   a second weighting factor circuit for adjusting the motion sensitized gradient profile from the second memory by a second weighting factor; and,
   a combining circuit for combining the weighted first and second gradient profiles from the first and second weighting factor adjusting circuits.

3. The magnetic resonance imaging system as set forth in claim 2 further including a circuit for adjusting the first and second weighting factors in accordance with a selected motion sensitization.

4. The magnetic resonance imaging system as set forth in claim 3 wherein the first and second weighting factor adjusting circuits further adjust the first and second weighting factors in accordance with at least one of a selected field of view and a selected slice thickness.

5. The magnetic resonance imaging system as set forth in claim 2 wherein the first and second weighting factor adjusting circuits further adjust the first and second weighting factors in accordance with at least one of a selected field of view and a selected slice thickness.

6. The magnetic resonance imaging system as set forth in claim 2 wherein the first weighting factor adjusting circuit and the combining circuit are connected with the gradient magnetic field controller to control the gradient magnetic field in a first repetition of an imaging sequence to apply the weighted reference gradient profile and in a second repetition of the imaging sequence to apply the combined weighted gradient profile from the combining circuit.

7. The magnetic resonance imaging apparatus as set forth in claim 6 further including:
   a sorting circuit connected with the receiver for sorting data lines generated with the weighted reference gradient profile into a first data memory and data lines generated with the combined weighted gradient profile into a second data memory;
   a reconstruction processor for reconstructing reference and motion sensitized images from the data in the first and second data memories; and,
   an image processor for processing the reference and motion sensitized images into appropriate format for display on a human readable monitor.

8. The magnetic resonance imaging system as set forth in claim 7 further including an image combining circuit for subtractively combining the reference and motion sensitized images to generate an image of moving tissue only, the image combining circuit being connected with the reconstruction processor and with the image processor for supplying a moving tissue only image thereto.

9. A method of magnetic resonance imaging comprising:
   positioning a subject within a temporarily constant magnetic field of a magnetic resonance imaging system;
   selecting a magnetic resonance imaging sequence in which excitement of magnetic resonance is followed by the application of a slice or slab gradient, a phase-encode gradient, and a read gradient;
   for at least one of the gradients, retrieving a reference gradient profile and retrieving a motion sensitized gradient profile, the reference and motion sensitized gradient profiles having common fields of view and slice thickness characteristics;
   selecting a motion sensitivity;
   weighting the reference and motion sensitized profiles in accordance with the selected motion sensitivity and combining the weighted profiles to form a combined gradient profile;
   performing the imaging sequence utilizing the combined gradient profile.

10. The method as set forth in claim 9 further including:
    selecting a field of view;
    weighting of the reference and motion sensitized gradient profiles in accordance with both the selected field of view and the selected motion sensitivity.

11. The method as set forth in claim 10 further including:
    selecting a slice thickness;
    adjusting the weighting of the reference and motion sensitized gradient profiles in accordance with the selected field of view, the selected slice thickness, and the selected motion sensitivity.

12. The method as set forth in claim 10 further including:
    selecting a slice thickness;
    weighting the reference and motion sensitized gradient profiles in accordance with both the selected slice thickness and the selected motion sensitivity.

13. The method as set forth in claim 9 wherein the reference and motion sensitized gradient profiles are read gradient profiles.

14. The method as set forth in claim 9 further including:
    during the imaging sequence, applying both the combined and reference gradient profiles;
    sorting data lines generated with the combined gradient profile and the reference gradient profile into a reference data line set and a motion sensitized data line set;
    reconstructing the reference and motion sensitized data line sets into reference and motion sensitized image representations.

15. The method as set forth in claim 14 further including:
    subtractively combining the reference and motion sensitized image representations to generate an image representation of moving tissue;
    connecting the moving tissue image representation into a human readable image.

16. The method as set forth in claim 9 wherein:
    in the step of weighting the reference gradient profile, the reference gradient profile is weighted in accordance with:

$$\alpha_1 = \frac{fm_1^{sen} - m_1^c}{m_1^{sen} - m_1^{ref}}$$

and in the step of weighting the motion sensitized gradient profile, the motion sensitized gradient profile is weighted in accordance with:

$$\alpha_2 = \frac{m_1^c - fm_1^{ref}}{m_1^{sen} - m_1^{ref}}$$

where $m_1^{sen}$ is a first order moment of the motion sensitized gradient profile, $m_1^c$ is the selected motion sensitivity of the combined gradient profile, $m_1^{ref}$ is the first order moment of the reference gradient profile, and 1/f is a ratio of a selected field of view or slice thickness to the minimum field of view or minimum slice thickness of the reference and motion sensitized gradient profiles.

17. A magnetic resonance imaging apparatus comprising:

a magnet for generating a temporarily constant magnetic field in an examination region;

a radio frequency pulse controller and transmitter for inducing dipoles in the examination region to resonance such that radio frequency resonance signals are generated;

gradient magnetic field coils and a gradient magnetic field controller for generating slice, phase and read magnetic field gradient pulses across the examination region;

a sequence controller for retrieving a reference gradient profile and for retrieving a motion sensitized gradient profile, the reference and motion sensitized gradient profiles having common fields of view and slice thickness characteristics;

a motion sensitivity selection circuit for selecting a motion sensitivity; and, a combining circuit for selectively weighting the reference and motion sensitized profiles in accordance with the motion sensitivity and combining the weighted profiles to form a combined gradient profile.

* * * * *